United States Patent
Park et al.

(10) Patent No.: US 9,093,662 B2
(45) Date of Patent: Jul. 28, 2015

(54) SEALING INSPECTION DEVICE AND SEALING INSPECTION METHOD OF FLAT PANEL DISPLAY APPARATUS BY USING THE SEALING INSPECTION DEVICE

(75) Inventors: Soon-Ryong Park, Yongin (KR); Woo-Suk Jung, Yongin (KR); Hee-Seong Jeong, Yongin (KR); Tae-Kyu Kim, Yongin (KR); Sun-Hwa Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 791 days.

(21) Appl. No.: 13/137,893

(22) Filed: Sep. 21, 2011

(65) Prior Publication Data
US 2012/0099106 A1 Apr. 26, 2012

(30) Foreign Application Priority Data
Oct. 26, 2010 (KR) .......................... 10-2010-0104737

(51) Int. Cl.
*G01J 4/00* (2006.01)
*H01L 51/52* (2006.01)
*G02F 1/13* (2006.01)
*G02F 1/1339* (2006.01)

(52) U.S. Cl.
CPC .......... *H01L 51/5246* (2013.01); *G02F 1/1309* (2013.01); *G02F 1/1339* (2013.01); *H01L 2251/568* (2013.01)

(58) Field of Classification Search
CPC ................ H01L 51/5246; H01L 2251/568; G02F 1/1339; G02F 1/1309; G02F 2203/28; G02F 2001/291; G02F 2001/294; G02F 2203/12; G02F 1/1313

USPC ........................................................ 356/364
See application file for complete search history.

(56) References Cited

U.S. PATENT DOCUMENTS

| 7,323,693 | B2 * | 1/2008 | Sanuki et al. ................ 250/372 |
| 2004/0021863 | A1 * | 2/2004 | Kurata et al. ................ 356/364 |
| 2004/0233432 | A1 * | 11/2004 | Akada et al. ................. 356/364 |
| 2007/0170861 | A1 * | 7/2007 | Lee et al. ...................... 313/512 |
| 2008/0002134 | A1 * | 1/2008 | Jeong ............................ 349/153 |
| 2009/0279088 | A1 * | 11/2009 | Fielden et al. ............... 356/364 |
| 2010/0007881 | A1 * | 1/2010 | Shyu et al. ................... 356/364 |
| 2010/0296092 | A1 | 11/2010 | Cho et al. |

FOREIGN PATENT DOCUMENTS

| JP | 54127273 | * 10/1979 | ............... H01J 9/42 |
| JP | 05-157519 A | 6/1993 | |
| JP | 06-148005 A | 5/1994 | |

(Continued)

*Primary Examiner* — Tarifur Chowdhury
*Assistant Examiner* — Sunghee Y Gray
(74) *Attorney, Agent, or Firm* — Lee & Morse, P.C.

(57) ABSTRACT

A sealing inspection device for detecting a bonding error at a sealing region of an upper and a lower plate in a flat panel display apparatus in which the upper and lower plates are bonded to each other by a sealing member, the sealing inspection device includes a light source configured to emit light, a polarizer configured to polarize the light emitted from the light source, the polarized light being incident on and reflected from the sealing region of the flat panel display, an optical spectrum analyzer configured to analyze the light reflected from the sealing region with respect to wavelength ranges and to determine whether a bonding error exits at the sealing region, and a beam splitter configured to change a path of the reflected light toward the optical spectrum analyzer.

20 Claims, 2 Drawing Sheets

(56) References Cited

FOREIGN PATENT DOCUMENTS

| JP | 09-113412 A | 5/1997 | |
| JP | 2008-020356 A | 1/2008 | |
| JP | 2010014628 * | 1/2010 | ............ G01N 21/21 |
| KR | 10 2001-0092988 A | 10/2001 | |
| KR | 10 2003-0090021 A | 11/2003 | |
| KR | 10 2009-0049226 A | 5/2009 | |
| KR | 10 2009-0121885 A | 11/2009 | |

* cited by examiner

SEALING INSPECTION DEVICE AND SEALING INSPECTION METHOD OF FLAT PANEL DISPLAY APPARATUS BY USING THE SEALING INSPECTION DEVICE

CROSS-REFERENCE TO RELATED PATENT APPLICATION

This application claims the benefit of Korean Patent Application No. 10-2010-0104737, filed on Oct. 26, 2010, in the Korean Intellectual Property Office, the disclosure of which is incorporated herein in its entirety by reference.

BACKGROUND

1. Field

An aspect of example embodiments relates to a sealing inspection device and a sealing inspection method of a flat panel display apparatus by using the sealing inspection device.

2. Description of the Related Art

Display apparatuses may include portable thin flat panel display apparatuses. For example, electroluminescent display apparatuses among the flat-panel display apparatuses are self emitting display apparatuses and are regarded as next generation display apparatuses due to their wide viewing angles, excellent contrast, and a fast response speed. Also, organic light-emitting display apparatuses, in which an emission layer is formed of an organic material, may display various colors and may have superior characteristics in terms of luminance, a driving voltage, and a response speed in comparison to inorganic light-emitting display apparatuses.

A general organic light-emitting display apparatus has a structure in which at least one organic layer including an emission layer is intervened between a pair of electrodes, i.e., first and second electrodes. The first electrode is formed on a substrate and functions as an anode for injecting holes, and the organic layer is formed on the first electrode. The second electrode is formed on the organic layer to face the first electrode and functions as a cathode for injecting electrons.

SUMMARY

According to an aspect of the example embodiment, there is provided a sealing inspection device for detecting a bonding error at a sealing region of an upper and a lower plate in a flat panel display apparatus in which the upper and lower plates are bonded to each other by a sealing member. The sealing inspection device may include a light source configured to emit light, a polarizer configured to polarize the light emitted from the light source, the polarized light being incident on and reflected from the sealing region of the flat panel display, an optical spectrum analyzer configured to analyze the light reflected from the sealing region with respect to wavelength ranges and to determine whether a bonding error exits at the sealing region, and a beam splitter configured to change a path of the reflected light toward the optical spectrum analyzer.

The light source may emit white light.

The polarizer may change a polarization state of the emitted light.

The polarizer may change a circular polarization state of the emitted light.

The optical spectrum analyzer may measure the reflectance of the reflected light in wavelength ranges, compare the measured reflectance to a reference value, in order to determine whether a bonding error exists at the sealing region.

The polarizer may be arranged to pass the polarized light toward a region of the flat panel display having the sealing member in direct contact with the upper and lower plates.

The beam splitter may be positioned to direct at least some of the light reflected from the sealing region toward the optical spectrum analyzer.

The bonding error may include separation or cracks at the sealing region.

The sealing inspection device may further include a microscope barrel for magnifying some of the reflected light, and an image capturing device for capturing an image of the sealing region by using the magnified reflected light.

The beam splitter may split the reflected light such that some of the reflected light is oriented toward the optical spectrum analyzer, and the other some of the reflected light oriented toward the microscope barrel.

The flat panel display apparatus may be an organic light-emitting display apparatus.

The sealing member may be frit.

According to another aspect of the example embodiment, there is provided a sealing inspection method for detecting a bonding error at a sealing region of an upper and a lower plate in a flat panel display apparatus in which the upper and lower plates are bonded to each other by a sealing member, the sealing inspection method including emitting light by using a light source, polarizing the emitted light by using a polarizer, reflecting the polarized light on the sealing region, and analyzing a reflectance of the reflected light in wavelength ranges and determining whether a bonding error exits at the sealing region.

The emitting of the light may include emitting white light by using the light source.

The polarizing of the emitted light may include changing a polarization state of the emitted light by using the polarizer.

The polarizing of the emitted light may include changing a circular polarization state of the emitted light by using the polarizer.

The analyzing and the determining may include measuring the reflectance of the reflected light in wavelength ranges, comparing the measured reflectance to a reflectance of the reflected light in wavelength ranges in a case when bonding at the sealing region is normal, and determining whether a bonding error exists at the sealing region.

The bonding error may include separation or cracks at the sealing region.

The sealing inspection method may further include capturing an image of the sealing region by using the reflected light.

The flat panel display apparatus may be an organic light-emitting display apparatus.

The sealing member may be frit.

The sealing inspection method may further include re-sealing the sealing region if a bonding error is determined at the sealing region.

Re-sealing may include irradiating a laser onto the sealing region.

BRIEF DESCRIPTION OF THE DRAWINGS

The above and other features and advantages of the example embodiment will become more apparent by describing in detail exemplary embodiments thereof with reference to the attached drawings in which.

DETAILED DESCRIPTION

Figure 1:
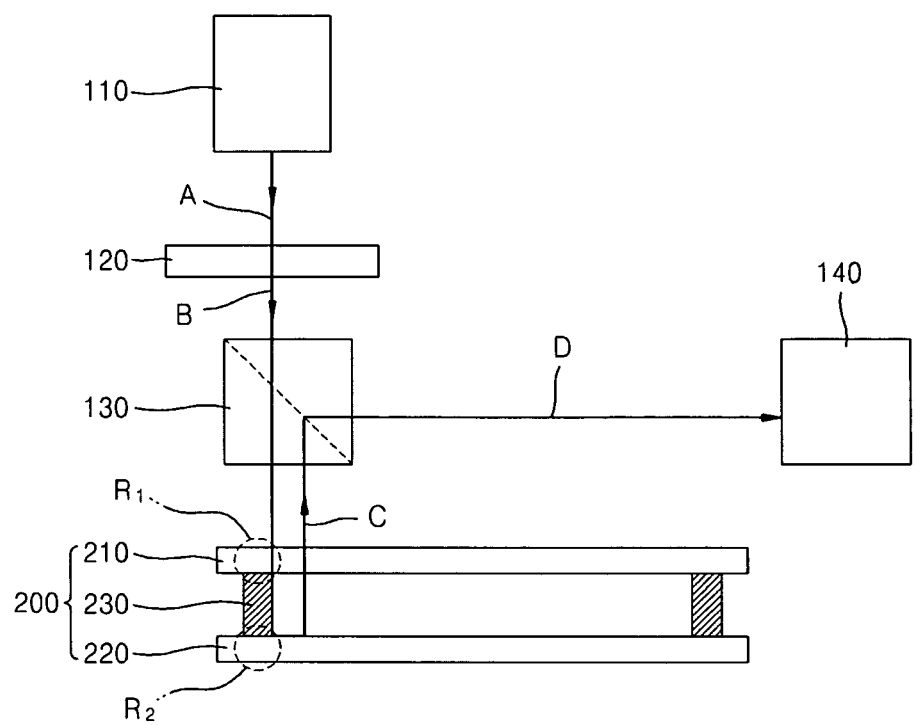
FIG. 1 is a structural view of a sealing inspection device according to an embodiment.

While exemplary embodiments of the invention are susceptible to various modifications and alternative forms, specific embodiments thereof are shown by way of example in the drawings and will herein be described in detail. It should be understood, however, that there is no intent to limit exemplary embodiments of the invention to the particular forms disclosed, but conversely, exemplary embodiments of the invention are to cover all modifications, equivalents, and alternatives falling within the spirit and scope of the invention. In the following description of the example embodiment, a detailed description of known functions and configurations incorporated herein will be omitted when it may make the subject matter of the example embodiment unclear.

If moisture or oxygen is permeated from an external environment into a diode of an organic light-emitting display apparatus, the lifetime of the diode may be reduced due to oxidation or separation of an electrode material of the diode. Thus, the organic light-emitting display apparatus may have reduced light-emitting efficiency and deteriorated color of emitted light.

Accordingly, when the organic light-emitting display apparatus is manufactured, a sealing process is generally performed to isolate the diode from the external environment and to prevent permeation of moisture. For example, the sealing process may be performed by laminating an organic polymer, e.g., polyethylene terephthalate (PET), metal, or glass containing a moisture absorbent on the second electrode of the organic light-emitting display apparatus. In this case, the laminated material with the moisture absorbent forms a cover or a cap, which is filled with a nitrogen gas, so edges of the cover or the cap may be encapsulated with a sealant, e.g., epoxy. Alternatively, a sealant, e.g., frit, may be used to bond a diode substrate and the cap, e.g., fit may be coated on each sealing region and followed by a laser irradiating device to cure the frit, to minimize further moisture and oxygen permeation, e.g., in a top-emission type organic light-emitting display apparatus, and to facilitate a manufacturing process.

According to an example embodiment, a sealing inspection device may be provided for detecting a bonding error at a sealing region between two bonded substrates in a flat panel display apparatus. The sealing inspection device will be described with reference to FIG. 1. FIG. 1 is a structural view of a sealing inspection device according to an embodiment.

Referring to FIG. 1, a flat panel display apparatus 200, e.g., a liquid crystal display apparatus or an organic light-emitting display apparatus, may include an upper plate 210 and a lower plate 220 that are bonded to each other by a sealing member 230. In particular, if the flat panel display apparatus 200 is an organic light-emitting display apparatus, an organic light-emitting diode (not shown) is formed on the lower plate 220. If moisture or oxygen is permeated from an external environment into the organic light-emitting diode of the organic light-emitting display apparatus, the lifetime of the organic light-emitting diode may be reduced due to oxidation or separation of an electrode material of the organic light-emitting diode. Thus, the organic light-emitting display apparatus may have reduced light-emitting efficiency and deteriorated color of emitted light. As such, the organic light-emitting display apparatus may use fit as the sealing member 230 to prevent permeation of moisture or oxygen from outside into the organic light-emitting display apparatus. Although fit generally refers to powdered glass, in an embodiment of the example embodiment, fit collectively refers to gelled glass formed by adding an organic material to powdered glass, and solid glass cured by irradiating a laser.

If frit is used as the sealing member 230, the upper and lower plates 210 and 220 are bonded to each other by disposing fit between the upper and lower plates 210 and 220, and then sealing the frit, e.g., by irradiating the frit with a laser beam. The upper and lower plates 210 and 220 may be formed of, e.g., transparent glass, a plastic sheet, or silicon, and may have flexible or inflexible characteristics, and transparent or non-transparent characteristics.

When a laser beam is irradiated on the sealant 230, a bonding error may be generated between the upper and lower plates 210 and 220 due to stress difference at sealing regions R1 or R2. The sealing inspection device according to the embodiment may inspect whether a bonding error exists at the sealing region R1 or R2 of the flat panel display apparatus 200.

As illustrated in FIG. 1, the sealing inspection device according to an embodiment may include a light source 110, a polarizer 120, a beam splitter 130, and an optical spectrum analyzer 140.

The light source 110 emits light (A). The light source 110 may emit every wavelength range of visible light. For example, the light source 110 may emit white light.

The polarizer 120 may polarize the light (A) emitted from the light source 110. The light (B) polarized by the polarizer 120 is incident on the flat panel display apparatus 200 and is reflected therefrom, i.e., reflected light (C), toward the optical spectrum analyzer 140. Example embodiments, however, are not limited thereto, e.g., emitted light (A) may be directly incident on the flat panel display apparatus 200 without passing through the polarizer 120 to be reflected toward the optical spectrum analyzer 140.

However, if non-polarized light is used, noise may be generated while analyzing the reflectance in the optical spectrum analyzer 140. If the light (B) polarized by the polarizer 120 is used, noise may be reduced in analyzing the reflected light (C). For example, the polarizer 120 may change a circular polarization state of the emitted light (A). The polarizer 120 polarizes the emitted light (A) by 0° to 180°.

The beam splitter 130 may refract the reflected light (C), such that the refracted light, i.e., reflected light (D), is incident on the optical spectrum analyzer 140. The optical spectrum analyzer 140 may analyze the light incident thereon, i.e., reflected light (D). That is, after the emitted light (A) is incident on the flat panel display apparatus 200 and is reflected from the sealing region R1 and/or R2, i.e., light (C), and divides or reflects light (D) to be incident on the optical spectrum analyzer 140, the optical spectrum analyzer 140 may determine whether a bonding error exists at the sealing region R1 and/or R2.

In more detail, the light (A) emitted from the light source 110 is polarized by the polarizer 120. The polarized light (B) is reflected from the sealing region R1 or R2 of the flat panel display apparatus 200, so the reflected light (C) is refracted by the beam splitter 130 and is incident on the optical spectrum analyzer 140. The optical spectrum analyzer 140 measures the reflectance of the reflected light (D) in wavelength ranges. The optical spectrum analyzer 140 compares the reflectance of the reflected light (D) to a reference value, i.e., reflectance of light from a sealing region without an error, and determines whether a bonding error exists at the sealing region R1 or R2.

For example, if the flat panel display apparatus 200 is an organic light-emitting display apparatus, the upper and lower plates 210 and 220 are bonded to each other by using frit as described above. In this case, frit is disposed between the upper and lower plates 210 and 220, and the upper and lower plates 210 and 220 are bonded to each other by using a laser beam. If cracks occur at the sealing region R1 or R2 during laser beam irradiation, e.g., due to a stress difference, separation may occur between the upper plate 210 and the sealing member 230 or between the lower plate 220 and the sealing member 230. Due to the cracks or separation, the optical spectrum analyzer 140 may detect a bonding error at the sealing region R1 or R2.

That is, the reflectance of the light (C) reflected from the sealing region R1 or R2 having a bonding error deviates, e.g., is greatly decreased or increased, relative to the reference value in a predetermined wavelength range, e.g., due to an uneven reflectance surface caused by cracks. This is because the upper or lower plate 210 or 220 changes from an isotropic state to an anisotropic state in a region where separation or cracks occur due to a stress difference.

Figure 3:
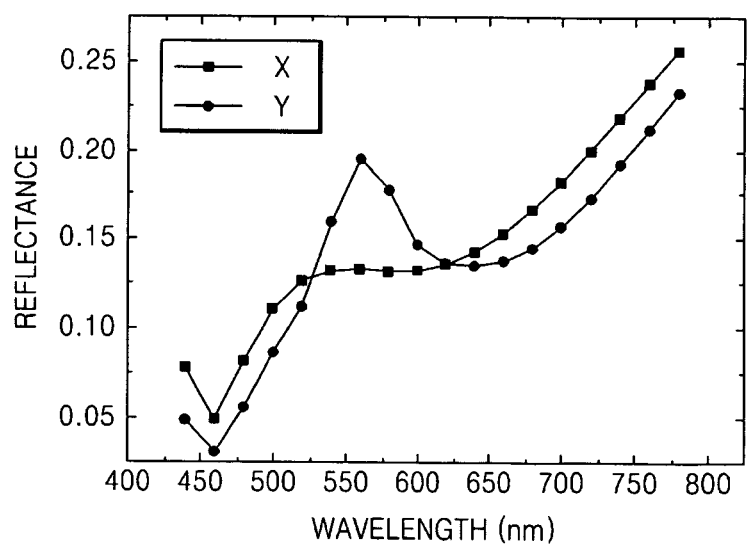
FIG. 3 is a graph showing variation of reflectance of reflected light in accordance with wavelength ranges in cases when a bonding error exists and does not exist.

For example, FIG. 3 illustrates a graph showing reflectance of reflected light in wavelength ranges in cases when a bonding error exists and does not exist. Referring to FIG. 3, a reflectance Y of reflected light at a sealing region of a flat panel display apparatus with a bonding error, e.g., separation or cracks in the sealing region, is increased at a predetermined wavelength region, i.e., about 550 nm to about 600 nm, in comparison to a reflectance X of reflected light at a sealing region of a flat panel display apparatus without bonding errors. The reflectance Y is increased at the wavelength of about 550 nm to about 600 nm because of a bonding error such as separation or cracks exists at the sealing region.

According to the embodiment, the optical spectrum analyzer 140 may analyze the reflectance of the reflected light (D) in wavelength ranges, may compare the reflectance of the reflected light (D) to a reference value, e.g., reflectance of the reflected light (D) in a case when bonding at the sealing region R1 or R2 does not exist, and may determine whether a bonding error exists at the sealing region R1 or R2.

Figure 2:
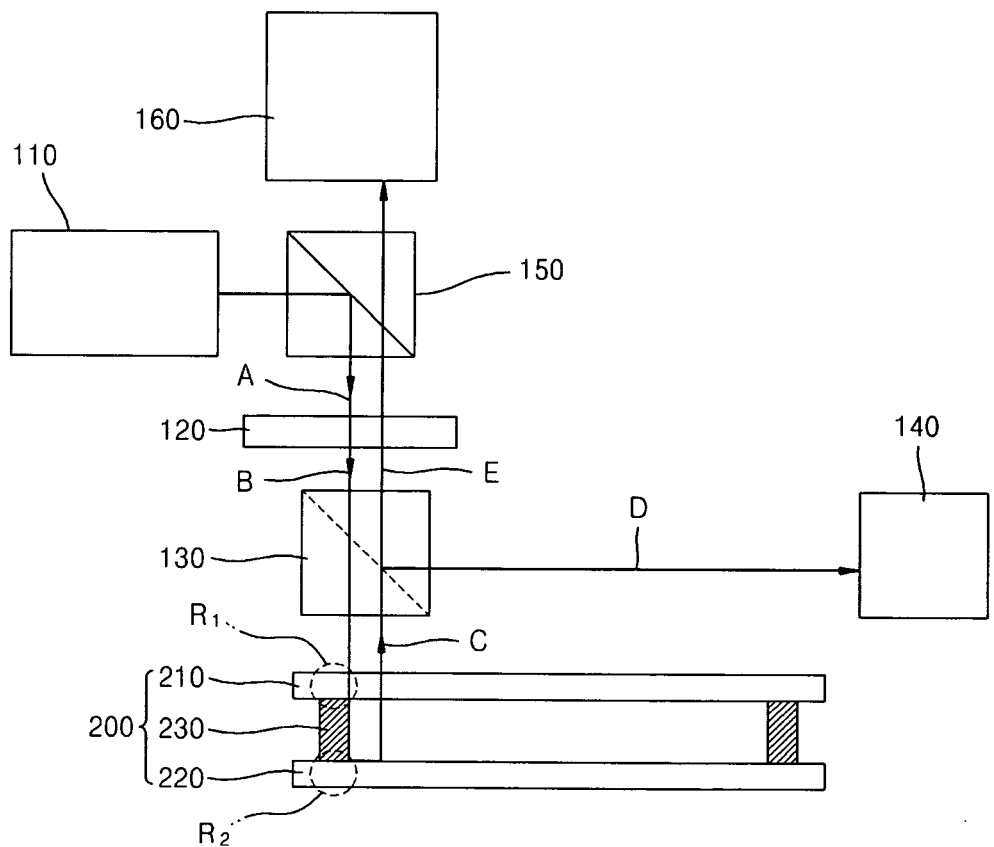
FIG. 2 is a structural view of a sealing inspection device according to another embodiment.

FIG. 2 illustrates a structural view of a sealing inspection device according to another embodiment. Referring to FIG. 2, the sealing inspection device according to the embodiment may be substantially the same as that of the device described previously with reference to FIG. 1, with the exception of further including a microscope barrel 150 and an image capturing device 160.

The microscope barrel 150 includes a plurality of lenses, and magnifies the reflected light (E). In detail, the reflected light (C) reflected from the sealing region R1 and/or R2 of the flat panel display apparatus 200 is split by the beam splitter 130, such that some light is refracted, i.e., refracted light (D), to proceed toward the optical spectrum analyzer 140, and some light is transmitted, i.e., reflected light (E), to be incident on the microscope barrel 150. The reflected light (E) incident on the microscope barrel 150 is magnified by the microscope barrel 150 and then is incident on the image capturing device 160.

The image capturing device 160 captures an image of the reflected light (E) that passes through the microscope barrel 150. Since the reflected light (E) is light reflected from the sealing region R1 or R2, and if the image of the reflected light (E) is captured, an image of the sealing region R1 and/or R2 may be obtained. Also, since the reflected light (E) is magnified by the microscope barrel 150, the image of the sealing region R1 and/or R2, which is captured by the image capturing device 160, may be checked with the naked eye.

If a bonding error at the sealing region R1 or R2 is found by the optical spectrum analyzer 140, a re-sealing process may be performed on the sealing region R1 or R2 having the bonding error. If the sealing member 230 is frit, the sealing process is re-performed by irradiating a laser beam onto the sealing region R1 or R2 having the bonding error.

According to example embodiments, a bonding error at a sealing region of a flat panel display apparatus may be detected by analyzing light reflected from the sealing region. In particular, the example embodiment provides a sealing inspection device capable of detecting a bonding error between a sealing member and upper/lower plates in a flat panel display apparatus, in which the upper and lower plates are bonded to each other by the sealing member, and a sealing inspection method of the flat panel display apparatus by using the sealing inspection device.

While the example embodiment has been particularly shown and described with reference to exemplary embodiments thereof, it will be understood by those of ordinary skill in the art that various changes in form and details may be made therein without departing from the spirit and scope of the example embodiment as defined by the following claims.

What is claimed is:

1. A sealing inspection device for detecting a bonding error at a cured sealing region between an upper and a lower plate in a flat panel display apparatus in which the upper and lower plates are bonded to each other by a sealing member, the sealing inspection device comprising:
    a light source emitting light;
    a polarizer polarizing the light emitted from the light source, the polarized light being incident on and reflected from the cured sealing region of the flat panel display;
    an optical spectrum analyzer configured to analyze the light reflected from the sealing region with respect to wavelength ranges to determine whether a bonding error exists at the sealing region based on measurement by the optical spectrum analyzer of the reflectance of the reflected light with respect to the wavelength ranges, and comparing the measured reflectance to a reference value to determine whether the bonding error exists at the cured sealing region; and
    a beam splitter configured to change a path of the reflected light toward the optical spectrum analyzer.

2. The sealing inspection device of claim 1, wherein the light source emits white light.

3. The sealing inspection device of claim 1, wherein the polarizer changes a polarization state of the emitted light.

4. The sealing inspection device of claim 3, wherein the polarizer changes a circular polarization state of the emitted light.

5. The sealing inspection device of claim 1, wherein the polarizer is arranged to pass the polarized light toward a region of the flat panel display having the sealing member in direct contact with the upper and lower plates.

6. The sealing inspection device of claim 1, wherein the beam splitter and the cured sealing region are arranged along a first direction, the beam splitter and the optical spectrum analyzer are arranged along a second direction perpendicular to the first direction, and the beam splitter is positioned to direct at least some of the light reflected from the cured sealing region toward the optical spectrum analyzer.

7. The sealing inspection device of claim 1, further comprising:
    a microscope barrel to magnify some of the reflected light; and
    an image capturing device to capture an image of the cured sealing region by using the magnified reflected light.

8. The sealing inspection device of claim 7, wherein the beam splitter to split the reflected light into a first light oriented toward the optical spectrum analyzer, and into a second light oriented toward the microscope barrel.

9. The sealing inspection device of claim 1, wherein the flat panel display apparatus is an organic light-emitting display apparatus.

10. The sealing inspection device of claim 9, wherein the sealing member is frit.

11. The sealing inspection device of claim 1, wherein the beam splitter and the cured sealing region are arranged to have the polarized light incident on a contact surface between the upper plate and the sealing member and on a contact surface between the lower plate and the sealing member, the polarized light being reflected from the cured sealing region to be reflected from the beam splitter toward the optical spectrum analyzer.

12. The sealing inspection device of claim 1, wherein the beam splitter is arranged to transmit the polarized light from the polarizer to be incident on two different regions of the cured sealing region, the polarized light being reflected from the two different regions of the cured sealing region to be reflected from the beam splitter toward the optical spectrum analyzer.

13. A method for manufacturing an organic light-emitting display apparatus including a cured sealing region between an upper and a lower bonded to each other by a sealing member, method comprising:
   emitting light by using a light source;
   polarizing the emitted light by using a polarizer;
   reflecting the polarized light from the cured sealing region; and
   analyzing a reflectance of the reflected light with respect to wavelength ranges and determining whether a bonding error exists at the cured sealing region, wherein the analyzing includes:
   measuring the reflectance of the reflected light in wavelength ranges, and
   comparing the measured reflectance to a reflectance of the reflected light in wavelength ranges in a case when bonding at the cured sealing region has no errors.

14. The method of claim 13, wherein emitting the light includes emitting white light.

15. The method of claim 13, wherein polarizing the emitted light includes changing a polarization state of the emitted light.

16. The method of claim 15, wherein polarizing the emitted light includes changing a circular polarization state of the emitted light.

17. The method of claim 13, further comprising capturing an image of the cured sealing region by using the reflected light.

18. The method of claim 13, further comprising re-sealing the cured sealing region if a bonding error is determined at the cured sealing region.

19. The method of claim 18, wherein re-sealing includes irradiating a laser onto the cured sealing region.

20. The method of claim 13, further comprising transmitting the polarized light through a beam splitter to be incident on the cured sealing region, such that the polarized light is incident on a contact surface between the upper plate and the sealing member and on a contact surface between the lower plate and the sealing member, and the polarized light is reflected from the cured sealing region to be reflected from the beam splitter toward an optical spectrum analyzer.

* * * * *